US007990289B2

(12) United States Patent
Monro (10) Patent No.: US 7,990,289 B2
(45) Date of Patent: Aug. 2, 2011

(54) COMBINATORIAL CODING/DECODING FOR ELECTRICAL COMPUTERS AND DIGITAL DATA PROCESSING SYSTEMS

(75) Inventor: Donald Martin Monro, Beckington (GB)

(73) Assignee: Intellectual Ventures Fund 44 LLC, Las Vegas, NV (US)

( * ) Notice: Subject to any disclaimer, the term of this patent is extended or adjusted under 35 U.S.C. 154(b) by 1044 days.

(21) Appl. No.: 11/777,256

(22) Filed: Jul. 12, 2007

(65) Prior Publication Data

US 2009/0016453 A1    Jan. 15, 2009

(51) Int. Cl.
H03M 7/00    (2006.01)
(52) U.S. Cl. ............................ 341/50; 341/51
(58) Field of Classification Search .......... 341/50, 341/51, 87, 107
See application file for complete search history.

(56) References Cited

U.S. PATENT DOCUMENTS

| | | | |
|---|---|---|---|
| 3,626,167 A | 12/1971 | Guck et al. | |
| 4,168,513 A | 9/1979 | Hains et al. | |
| 4,509,038 A | 4/1985 | Hirano | |
| 4,792,793 A | 12/1988 | Rawlinson et al. | |
| 4,929,946 A | 5/1990 | O'Brien et al. | |
| 5,313,203 A | 5/1994 | Suu et al. | |
| 5,357,250 A | 10/1994 | Healey et al. | |
| 5,710,561 A * | 1/1998 | Schmidt et al. | 341/63 |
| 5,748,786 A | 5/1998 | Zandi et al. | |
| 5,754,704 A | 5/1998 | Barnsley et al. | |
| 5,764,803 A | 6/1998 | Jacquin et al. | |
| 5,768,437 A | 6/1998 | Monro et al. | |
| 5,818,877 A | 10/1998 | Tsai et al. | |
| 5,915,044 A | 6/1999 | Gardos et al. | |
| 6,078,619 A | 6/2000 | Monro et al. | |
| 6,188,334 B1 | 2/2001 | Bengio et al. | |
| 6,225,925 B1 | 5/2001 | Bengio et al. | |
| 6,272,241 B1 | 8/2001 | Tattersall | |
| 6,281,817 B2 | 8/2001 | Bengio et al. | |
| 6,320,522 B1 * | 11/2001 | Satoh | 341/51 |
| 6,373,411 B1 | 4/2002 | Shoham | |
| 6,556,719 B1 | 4/2003 | Monro | |
| 6,563,438 B2 | 5/2003 | Satoh | |
| 6,990,145 B2 | 1/2006 | Monro et al. | |
| 7,015,837 B1 | 3/2006 | Malvar | |
| 7,030,789 B1 | 4/2006 | Cideciyan et al. | |
| 7,082,483 B2 | 7/2006 | Poo | |
| 7,155,445 B1 | 12/2006 | Kling et al. | |
| 7,265,691 B2 | 9/2007 | Tomic | |
| 7,301,485 B2 | 11/2007 | Senda | |
| 7,340,013 B2 | 3/2008 | Ammer et al. | |

(Continued)

FOREIGN PATENT DOCUMENTS

EP    0595599 A2    5/1994

(Continued)

OTHER PUBLICATIONS

Notice of Allowance on U.S. Appl. 12/423,935, mailed Nov. 12, 2010.

(Continued)

Primary Examiner — Khai M Nguyen (57) ABSTRACT

Embodiments described herein may include example embodiments of a method, article and apparatus for compressing data utilizing combinatorial coding which may be used for communicating between two or more components connected to an interconnection medium (e.g., a bus) within a single computer or digital data processing system, and/or for communication between computing platforms via a network or other interconnection medium.

34 Claims, 4 Drawing Sheets

U.S. PATENT DOCUMENTS

| | | | |
|---|---|---|---|
| 7,453,377 B2 * | 11/2008 | Lee et al. | 341/51 |
| 2004/0126018 A1 | 7/2004 | Monro | |
| 2004/0165737 A1 | 8/2004 | Monro | |
| 2010/0085218 A1 | 4/2010 | Monro | |
| 2010/0085221 A1 | 4/2010 | Monro | |
| 2010/0085224 A1 | 4/2010 | Monro | |
| 2010/0238056 A1 | 9/2010 | Seki et al. | |

FOREIGN PATENT DOCUMENTS

| | | |
|---|---|---|
| EP | 0836325 | 4/1998 |
| EP | 0 939 554 A | 9/1999 |
| GB | 2293733 A | 4/1996 |
| WO | WO97/16029 | 5/1997 |
| WO | WO 99/08449 | 2/1999 |
| WO | WO 01/63935 | 8/2001 |

OTHER PUBLICATIONS

R.F. Rice, "Some Practical Universal Noiseless Coding Techniques," Jet Propulsion Laboratory, Pasadena, California, JPL Publication 79-22, Mar. 1979.

Office Action on U.S. Appl. No. 12/463,584, mailed Apr. 2, 2010.

Notice of Allowance from U.S. Appl. No. 11/776,786, mailed Jun. 17, 2009.

Non-final Office Action on U.S. Appl. No. 12/423,935, mailed Jul. 8, 2010.

Notice of Allowance on U.S. Appl. No. 12/463,584, mailed Aug. 19, 2010.

U.S. Appl. No. 11/777,239, filed Jul. 12, 2007, Monro.
U.S. Appl. No. 11/777,230, filed Jul. 12, 2007, Monro.
U.S. Appl. No. 11/777,144, filed Jul. 12, 2007, Monro.
U.S. Appl. No. 11/777,130, filed Jul. 12, 2007, Monro.
U.S. Appl. No. 11/777,122, filed Jul. 12, 2007, Monro.
U.S. Appl. No. 11/777,100, filed Jul. 12, 2007, Monro.
U.S. Appl. No. 11/777,081, filed Jul. 12, 2007, Monro.
U.S. Appl. No. 11/777,022, filed Jul. 12, 2007, Monro.
U.S. Appl. No. 11/776,786, filed Jul. 12, 2007, Monro.
U.S. Appl. No. 11/422,316, filed Jun. 5, 2006, Monro.

De Natale, et al., "A Mesh-Interpolation Scheme for Very-Low Bitrate Coding of Video Sequences" European Transactions on Telecommunications, vol. 9, No. 1, pp. 47-55, 1998.

Tian et al., "Image Data Processing in the Compressed Wavelet Domain" Proceedings of ICSP'96, pp. 978-981, 1996.

Said et al., "A New, Fast, and Efficient Image Codec Based on Set Partitioning in Hierarchical Trees" IEEE Transactions on Circuits and Systems for Video Technology, vol. 6, No. 3, pp. 243-250, Jun. 1996.

Shapiro, "Embedded Image Coding Using Zerotrees of Wavelet Coefficients" IEEE Transactions on Signal Processing, vol. 41, No. 12, pp. 3445-3462, Dec. 1993.

Horst et al., "Mupcos: A multi-purpose coding scheme" Signal Processing: Image Communication 5, pp. 75-89, 1993.

International Search Report and Written Opinion for PCT/US2008/069539 completed Sep. 30, 2008.

International Search Report and Written Opinion for PCT/US2008/069543 completed Sep. 30, 2008.

International Search Report and Written Opinion for PCT/US2008/069502, mailed Nov. 3, 2008.

Communication and Written Opinion for PCT/US2008/069497 mailed Oct. 9, 2008.

Communication and Written Opinion for PCT/US2008/069317 mailed Oct. 9, 2008.

Anonymous: "Conversion Between Different Number Systems" Internet Article, [Online] Nov. 11, 2002, XP002494744. Retrieved from the Internet: URL: http://www.cstc.org/data/resouces/60/convexp.html> [retrieved on Sep. 5, 2008].

Bose, B. et al., "Lee Distance Gray Codes" Information Theory, 1995. Proceedings 1995 IEEE International Symposium, Whistler, BC, Canada Sep. 17-22, 1995, New York, NY, IEEE, US Sep. 17, 1995, p. 236, XP010192708.

Notice of Allowance for U.S. Appl. No. 11/777,081, mailed Oct. 13, 2009.

Non-Final Office Action on U.S. Appl. No. 11/777,230, mailed Feb. 1, 2011.

* cited by examiner

Figure 5 ps://www.w3.org/2000/svg" viewBox="0 0 100 100">

COMBINATORIAL CODING/DECODING FOR ELECTRICAL COMPUTERS AND DIGITAL DATA PROCESSING SYSTEMS

BACKGROUND

1. Field

The present disclosure relates to data compression, and more specifically data compression utilizing combinatorial coding within electrical computers and digital data processing systems. Subject matter disclosed herein may relate to processes or apparatus for transferring data from one or more peripherals to one or more computers or digital data processing systems for the latter to process, store, and/or further transfer and/or for transferring data from the computers or digital data processing systems to the peripherals. Subject matter disclosed herein may relate to processes or apparatus for interconnecting or communicating between two or more components connected to an interconnection medium a within a single computer or digital data processing system. Subject matter disclosed herein may relate to processes or apparatus for transferring data from one computer or digital processing system to another computer or digital processing system via a network or other interconnection medium.

2. Background Information

In recent years it has become common for persons to share data over networks; however, transmission of data has a cost in terms of bandwidth utilization. Therefore, large amounts of data, for example, are often compressed. Compression may also be used, for example, in storing data on magnetic or other media, in transferring data from one component to another within a computing platform, and/or in transferring data to and/or from a peripheral device to and/or from a computing platform.

BRIEF DESCRIPTION OF THE DRAWINGS

Subject matter is particularly pointed out and distinctly claimed in the concluding portions of the specification. The claimed subject matter, however, both as to organization and the method of operation, together with objects, features and advantages thereof, may be best understood by reference to the following detailed description if read with the accompanying drawings in which:

DETAILED DESCRIPTION

In the following detailed description, numerous details are set forth in order to provide a thorough understanding of the present claimed subject matter. However, it will be understood by those skilled in the art that the claimed subject matter may be practiced without these specific details. In other instances, well-known methods, procedures, components, and circuits have not been described in detail so as to not obscure the claimed subject matter.

Various operations may be described as multiple discrete operations in turn, in a manner that may be helpful in understanding embodiments of the claimed subject matter; however, the order of description should not be construed to imply that these operations are order dependent.

For the purposes of the description, a phrase in the form "A/B" means A or B. For the purposes of the description, a phrase in the form "A and/or B" means "(A), (B), or (A and B)". For the purposes of the description, a phrase in the form "at least one of A, B, and C" means "(A), (B), (C), (A and B), (A and C), (B and C), or (A, B and C)". For the purposes of the description, a phrase in the form "(A)B" means "(B) or (AB)" that is, A is an optional element.

For purposes of the description, a phrase in the form "below", "above", "to the right of", etc. are relative terms and do not require that the claimed subject matter be used in any absolute orientation.

Reference in the specification to a processing and/or digital "device" and/or "appliance" means that a particular feature, structure, or characteristic, namely device operable connectivity, such as the ability for the device to be execute or process instructions and/or programmability, such as the ability for the device to be configured to perform designated functions, is included in at least one embodiment of the digital device as used herein. Accordingly in one embodiment, digital devices may include general and/or special purpose computing devices, connected personal computers, network printers, network attached storage devices, voice over internet protocol devices, security cameras, baby cameras, media adapters, entertainment personal computers, and/or other networked devices suitably configured for practicing claimed subject matter in accordance with at least one implementation; however these are merely a few examples of processing devices and/or computing platforms to which claimed subject matter is not limited.

The description may use the phrases "in an embodiment," or "in embodiments," which may each refer to one or more of the same or different embodiments. Furthermore, the terms "comprising," "including," "having," and the like, as used with respect to embodiments of the claimed subject matter, are synonymous.

Some portions of the detailed description which follow are presented in terms of algorithms and/or symbolic representations of operations on data bits and/or binary digital signals stored within a computing system, such as within a computer and/or computing system memory. These algorithmic descriptions and/or representations are the techniques used by those of ordinary skill in the data processing arts to convey the substance of their work to others skilled in the art. An algorithm is here, and generally, considered to be a self-consistent sequence of operations and/or similar processing leading to a desired result. The operations and/or processing may involve physical manipulations of physical quantities. Typically, although not necessarily, these quantities may take the form of electrical and/or magnetic signals capable of being stored, transferred, combined, compared and/or otherwise manipulated. It has proven convenient, at times, principally for reasons of common usage, to refer to these signals as bits, data, values, elements, symbols, characters, terms, numbers, numerals and/or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing", "computing", "calculating", "determining" and/or the like refer to the actions and/or processes of a computing platform, such as a computer or a similar electronic computing device, that manipulates and/or transforms data represented as physical electronic and/or magnetic quantities and/or other physical quantities within the computing platform's processors, memories, registers, and/or other information storage, transmission, and/or display devices.

Figure 1:
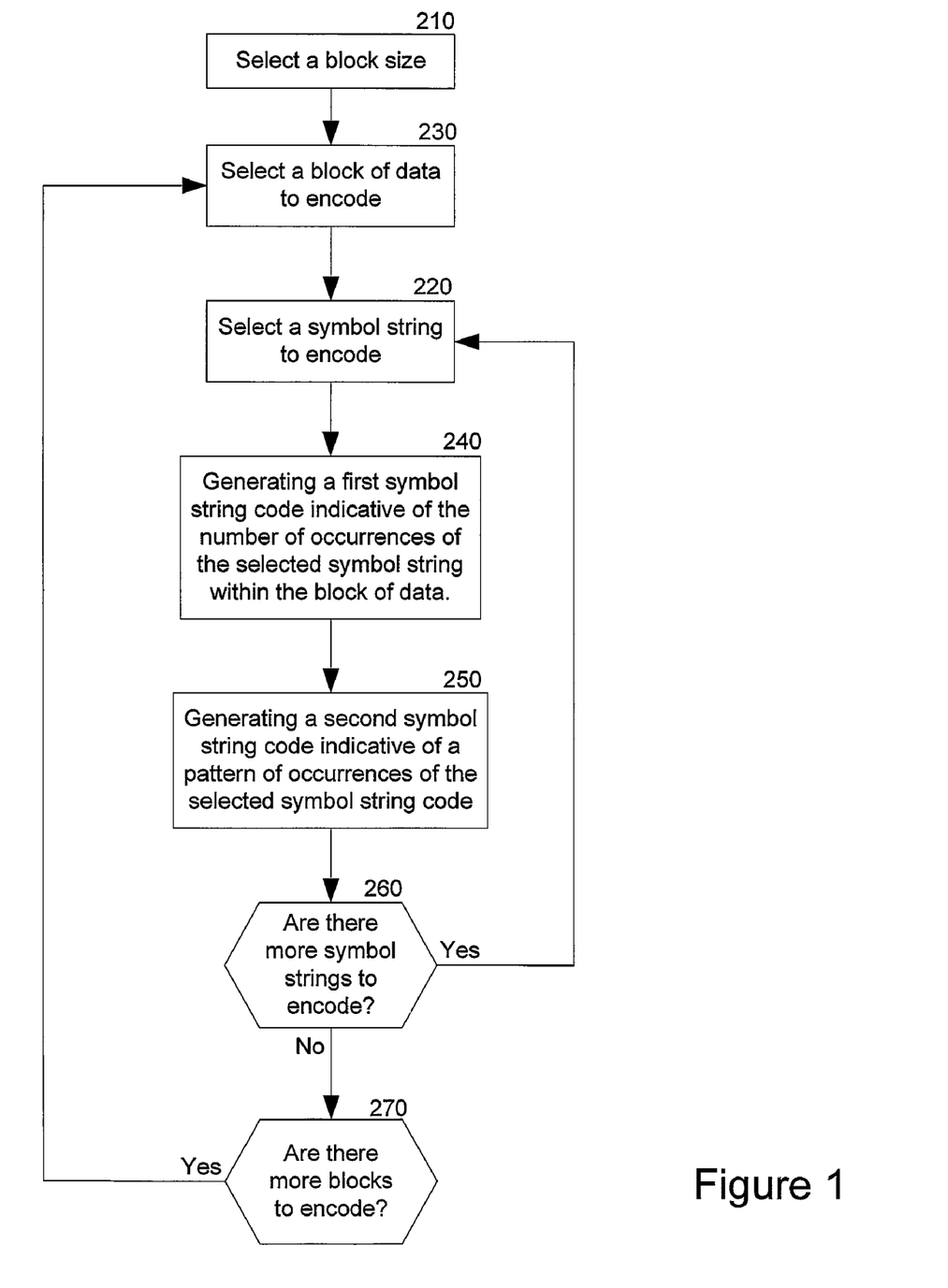
FIG. 1 is a flowchart illustrating an example embodiment of a combinatorial coding scheme in accordance with claimed subject matter.

FIG. 1 is a flowchart illustrating an embodiment of a combinatorial coding scheme in accordance with the claimed subject matter. Although the claimed subject matter is not limited in scope in this respect, one particular embodiment of a method of compressing data is described hereinafter. Action 210 illustrates that, in one embodiment, a block size may be selected or determined. In some embodiments, this may facilitate the portioning of long data sequences into more manageable or efficient portions. Action 220 illustrates that, in one embodiment, a symbol or symbol string may be selected that occurs within a block, set, or grouping of data to be compressed. Action 230 illustrates that, in one embodiment, a first or next block of data may be selected for compression. Action 240 illustrates that, in one embodiment, a first symbol string code (hereafter 'r') indicative of the number of occurrences of the symbol string within the grouping of data to be compressed may be generated. Action 250 illustrates that, in one embodiment, a second symbol string code (hereafter 's') indicative of the pattern of occurrences of the symbol string code may be generated. Action 260 illustrates that, in one embodiment, all or part of the technique may be repeated for additional symbols or symbol strings of data. Action 270 illustrates that, in one embodiment, all or part of the technique may be repeated for additional blocks of data. In other embodiments, part of the technique may be repeated for further symbol strings within the data. Respective symbol string codes may then be combined to form a data code. A resulting data code is a compressed form of the set or grouping of data. In various embodiments, this data code may be transmitted or stored as desired.

In at least some embodiments described, compression is lossless, although claimed subject matter is not limited in scope in this respect. For example, in some embodiments, a compressed data code may include information on positions of those symbol strings contained within the data to be compressed.

In one embodiment, the illustrated technique may operate particularly well with a small number of symbols and short groupings or blocks of data. In various embodiments, it may be particularly suitable when data is a sequence of binary digits in which two states occur, such as, for example, 'on' and 'off', or 'red' and 'green' or 'guilty' and 'not guilty'. Such binary data may in particular embodiments be represented as a series of the digits '0' and '1'.

Accordingly the illustrated technique may be used, in various embodiments, to code runs or patterns of binary data and may be, in some instances, a viable alternative to previously known methods such as arithmetic coding or Golomb coding. The illustrated technique is not, however, restricted to binary coding and one particular embodiment may be to code a sequence of different data symbols as will be described.

Action 210 illustrates that, in one embodiment, a block size may be selected or determined. In some embodiments, this may facilitate the portioning of long data sequences into more manageable or efficient portions. In one embodiment, data, such as stored as a file, a record or other unitary association of data, as one example, might be treated as a whole, or instead partitioned or divided into convenient lengths, long enough for symbol groupings, referred to here as symbol strings, to be coded with some amount of compression efficiency, but short enough to be conveniently processed. However, these are merely a few reasons that may be used to determine the portioning of the uncompressed data, and the claimed subject matter is not limited by these illustrative examples.

Action 220 illustrates that, in one embodiment, a symbol or symbol string may be selected that occurs within a block, set, or grouping of data to be compressed. In one embodiment, symbols may comprise any type, form or format of data. For example, the symbol may include items, such as, for example, records, files, sectors, clusters, groupings and/or portions thereof. Furthermore, in other embodiments, symbols may comprise words, bytes, bits, text, characters and/or the like. However, these are merely a few illustrative examples to which the claimed subject matter is not limited. In one embodiment, symbol strings may comprise single or multiple symbols. Conversely, in other embodiments, they may be fixed or variable in length.

In this particular context, any grouping, set, block or portion of associated data to be compressed may be treated as an ordered sequence of characters or other symbols. If, in one embodiment, such data is representative of text, for example, individual symbols may comprise one or more text characters, but, of course, the claimed subject mater is not limited in that respect. In other embodiments many other symbols may also be represented. More generally, symbols may be presented by bytes or other sized groupings of data, in various embodiments. It is also possible that, in some embodiments, longer or short portions of data could be used, which may or may not fit within a byte or digital word length, for example. If in a particular embodiment data is represented in binary form, a symbol could be represented, depending on the particular embodiment, as a single bit or multiple bits of fixed or variable length.

For one particular embodiment, symbol strings may be coded in a particular or a substantially predetermined order, although, again, this is merely an example embodiment and the claimed subject matter is not limited in scope in this respect. Alternatively or in addition, rather than coding in an order, in another embodiment, symbol strings may be coded in any order. In such an embodiment a symbol string code may be prefixed by some other code indicative of the particular symbol string, for example, although the claimed subject matter is of course not limited in scope to this example embodiment. Likewise, for one particular embodiment, the approach employed may be switchable between modes, such as a mode in which symbol string codes are transmitted or stored in a predetermined order, and a mode in which the order is not predetermined, but in which, in this latter mode, some code representative of a corresponding symbol string is sent before or as part of a symbol string code.

Furthermore, in various embodiments, side or additional information about all or some symbol strings may also be included in the compressed data code. In one particular embodiment, additional information relating to a particular symbol string may be sent at the end of or otherwise associated with a corresponding symbol string code. Alternatively, in another embodiment, additional information may be sent or stored after sending or storing symbol string codes. More generally, in various embodiments, additional information could be provided at any time or in any manner so that a decoder is capable of associating that information with a corresponding symbol string. In one embodiment, a list or table of symbol strings to be used may be predetermined or predefined, for example. Alternatively or in an additional embodiment, it may be compiled based at least in part on symbol strings which occur in data to be compressed, for example.

Initially, for example, in one particular embodiment, a list or table of symbol strings that may occur within a set of data may be established. Added to this list might be, in one embodiment, an initial list of symbol strings based at least in part on a priori knowledge or information regarding statistics for the data. For example, for an embodiment involving text, a common symbol string might comprise "ee", frequently occurring words such as "and" or "or", or a punctuation symbol followed by a blank, to provide some simple examples. Of course, the claimed subject matter is not limited in scope to these examples or to this particular embodiment. Many possible variations are also intended to be included within the scope of claimed subject matter.

In another embodiment, a particular set of data, as another example, might be examined before coding begins to identify symbol strings that occur commonly. Alternatively, or in addition, if partitioning is applied, these partitions, for example, may be handled separately or independently using an initial list of symbol strings. This initial list may have been determined, for example, at least in part from symbol strings which may have been found in earlier data partitions, for example.

Alternatively, symbol strings may be added as coding proceeds, as occurs in Lempel-Ziv-Welsh (LZW) coding, as an example. However, in one embodiment example, coding symbol strings, as described below, may be different from the approach used in LZW coding. In LZW, a symbol string is coded by substitution of another, longer symbol or string. For that reason, LZW may, at times, not compress sets of data and, in some cases, may produce longer sets of data. In contrast, embodiments in accordance with the claimed subject matter may result in compression.

As illustrated by Actions 240 & 250, to compress a grouping or a set of data, a first symbol string may be selected from a list of available symbol strings. Occurrences of that string in the data are located. Positions of the first symbol string within the data are retained. This process, in one embodiment, may be then repeated for additional symbol strings for the data so as to specify the set or grouping. Data comprising symbol strings may be processed in any order, although sequentially from beginning to end of the set or grouping of data may be one convenient approach.

Typically, coding may be carried out by a hardware or software coder. In one possible embodiment, a coder may be arranged to transmit data, after being coded, across a communications channel to a decoder which may be arranged, in real time or otherwise, to use received coded data to reconstruct the set of data. For an embodiment, coded data may be transferred between components in a computing platform.

Figure 2:
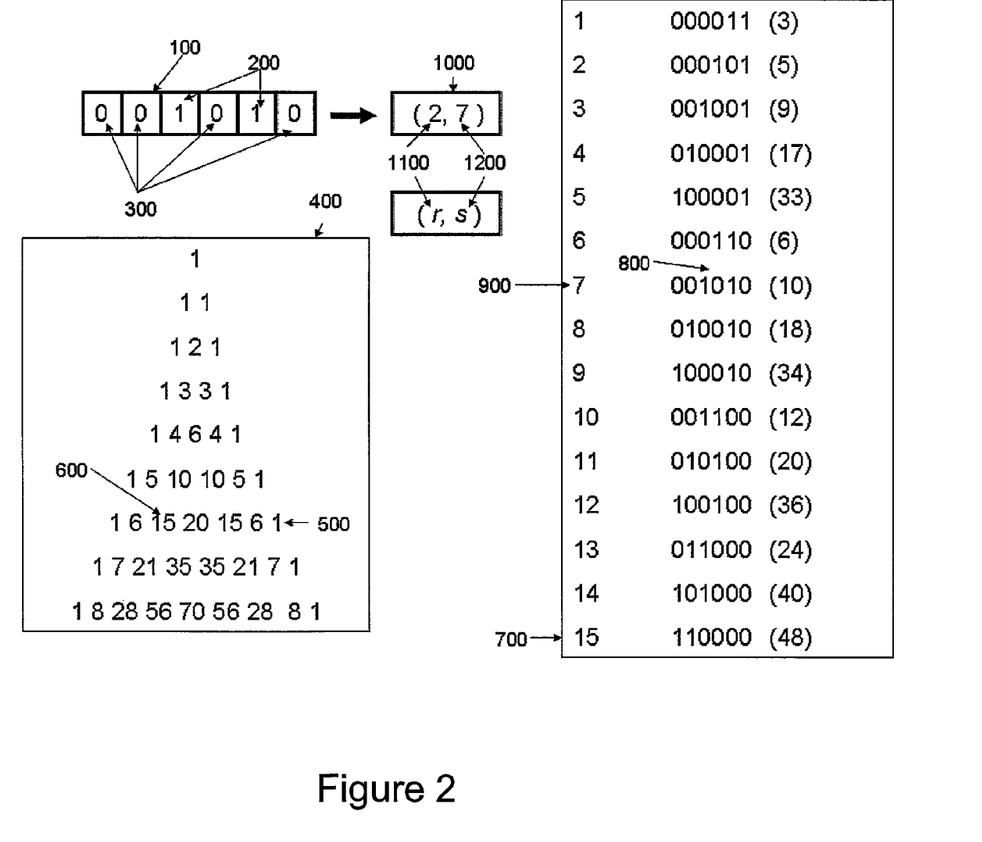
FIG. 2 is a diagram illustrating an example embodiment of a combinatorial coding scheme in accordance with claimed subject matter.

Again, the claimed subject matter is not limited in scope to a particular embodiment. Therefore, the embodiments described previously or hereinafter are intended simply as examples for purposes of illustration. Many other approaches and/or embodiments are intended to be included within the scope of claimed subject matter other than these specific examples. Nonetheless, continuing with these examples, reference is now made to FIG. 2. FIG. 2 is a schematic diagram of one potential embodiment in accordance with claimed subject matter.

FIG. 2 illustrates one specific, non-limiting, illustrative embodiment involving the coding of a sequence of 6 binary bits, 100, although any length might be used and the claimed subject matter is not limited in that respect. Of course, the claimed subject matter is not limited to this example embodiment or to any one particular embodiment. This example is simply an illustration for explanatory purposes. Many other potential embodiments are intended to be included within the scope of claimed subject matter.

The binary sequence 100 is a pattern which contains '0' bits in certain positions 300 and '1' bits in other positions 200. Action 240 of FIG. 1 illustrates that, in one embodiment, a first symbol string code (hereafter 'r') indicative of the number of occurrences of the symbol string within the grouping of data to be compressed may be generated. In this embodiment, the coder may examine the binary sequence 100 and in particular determines that there are two '1' bits 200 in the pattern. Although there are $2^6=64$ different patterns of 6 bits there is a certain lesser number of possible patterns or combinations of 6 bits which include only two '1' bits which is much less than 64. These 15 possible combinations of 6 bits which include only two '1' bits may be in general referred to as $_6C_2=15$. The Table of numbers 400 is well known as Pascal's triangle, and lists all the values of $_nC_r$ for row n from 0 to 8 with r counting across each row starting from 0. Each number in the triangle is the sum of the two immediately above it, and the sum of the numbers across row n is $2^n$, i.e. the number of different patterns of n bits. To code the binary sequence 100, the number of '1' bits is 2 and it is noted in Pascal's triangle 400 in row 6 that for r=2 at 600 there are 15 patterns corresponding to r=2.

Action 250 illustrates that, in one embodiment, a second symbol string code (hereafter 's') indicative of the pattern of occurrences of the symbol string code may be generated. The 15 possible patterns of 6 bits which include only two '1' bits are listed in table 700, from which it is found at 800 that pattern number 7 at 900 is the one corresponding to the data 100. The code for data 100 is therefore the two symbols at 1000 which are (2, 7), or in general (r, s).

It is understood that various indexes may be assigned to the possible combinations of the n bit blocks which include only r occurrences of the selected symbol. In one embodiment, both the decoder and encoder may know the index assignment a priori. Alternatively, in other embodiments the index assignment may accompany the compressed data. Or, in yet another embodiment, the indexes may be independently derived. However, these are merely a few non-limiting examples of ways to assign index values to the combinations.

The code to describe this data is in two parts at 1000, a first code r 1100 that represents 2 and a second code s 1200 that represents 7. This code may contain fewer than 6 bits and if so the data 100 is compressed by the code 1000. In various embodiments, the symbols selected, per Action 220 of FIG. 1 and described above, may be non-binary or larger binary symbols than illustrated by this specific, non-limiting, illustrative example of FIG. 2.

In a different embodiment, the coder might have determined the number of '0' bits 300 as 4, which would give 4 as the first code r and one of 15 patterns with 4 zeros as the second code s, because $_6C_4$ is the same as $_6C_2=15$. Therefore, in this embodiment, the resulting compressed code 1000 would be (4, 7).

As described above, in various embodiments, coder and decoder may contain lists of patterns s for different lengths of sequences n and different numbers of the selected symbol (here the '1' bit) r within these sequences. Alternatively, in other embodiments, the coder and decoder may have access to such lists or have the capability of generating such lists or selected portions of such lists. In general there may be $2^n$ different patterns of the data but only $_nC_r$ patterns with r bits, which is often less than $2^n$. The illustrated technique may utilize the fact, that $_nC_r$ is always less than $2^n$, to achieve compression. In various embodiments, the lists of patterns may be ordered in any convenient way which enables the coder and decoder to select the same pattern s. Alternatively, in other embodiments, they may be calculated by a coder or decoder when required. The described technique may be referred to as Combinatorial Coding because it is based on selecting ordered combinations to describe the positions of symbol strings in the data, in this illustrative case shown by FIG. 2 the symbol string being the binary digit '1'.

Equally, in other illustrative embodiments, the coder and decoder might work with '0' bits, when there would be n-r of them. The first code would be n-r and the second code would indicate a pattern with n-r '0' bits. The number of patterns with n-r bits is $_nC_{n-r}$ which is always the same as $_nC_r$.

The number of bits r may, in one embodiment, be coded efficiently by various techniques such as, for example, Huffinan, Golomb, hybrid Huffinan/Golomb as taught by Monro in U.S. patent application Ser. No. 11/422,316, arithmetic coding or any other method. In some embodiments the hybrid Huffinan/Golomb coder may out perform Huffinan coding in some circumstances and that it may even approach the efficiency of Huffinan coding with probability distributions that are ideal for Huffinan coding. As the hybrid Huffinan/Golomb coder is of low complexity, it may be used to code the number of bits r in an embodiment, although the claimed subject matter is not limited in this respect.

In one embodiment, the pattern number s may similarly be coded by various techniques such as, for example, Huffinan, Golomb, hybrid Huffinan/Golomb, arithmetic coding or any other method including methods as yet undisclosed. It is a feature of various embodiments of the illustrated technique that once r is known, all the $_nC_r$ possible patterns are equally likely, as long as the probability of occurrence of a '1' bit is constant. In embodiments where $_nC_r$ is a power of 2, the coder may do no better than code s by $\log_2(_nC_r)$ bits. Sometimes this may occur, and sometimes $_nC_r$ may be just less than a power of 2. In both these instances, as they arise, the coder, in one embodiment, may simply use $\log_2(_nC_r)$ bits (perhaps rounded up) without further coding. Efficient coding of $_nC_r$ equally probable outcomes when $_nC_r$ is not a power of 2 may be difficult or inconvenient in some instances.

The mathematics in the binary case or embodiment may prove instructive. Working with '1' as the coded digit, let the probability of occurrence of a '1' be q over both long and short blocks of binary data, i.e. q is stationary. In an embodiment, the theoretical cost, or entropy, of coding of each bit from this data is $$e_q(1) = -q\log_2(q) - (1-q)\log_2(1-q)$$

In a block of n bits, then, the probability of r bits which are '1' is $$p_q(r) = q^r(1-q)^{n-r}$$

The entropy or theoretical cost of coding each bit by an efficient method is $$e_q(n) = -\sum_{r=0}^{n} p_q(r)\log_2 p_q(r) \text{ bits.}$$

At n=1 this gives the identical result to $e_q(1)$, so that the theoretical total cost of coding n bits is $ne_q(n)$ bits.

Embodiments of coders disclosed herein may consider the different patterns that might occur. There are $_nC_r$ possible patterns of r bits from n, and each is equally likely, so the probability of a pattern of r bits from n is $c_q(n, r) = {_nC_r}p_q(r)$.

The theoretical cost of using the technique described herein here can be calculated, in one embodiment, as the cost of selecting a value of r and the cost of sending the selected pattern s. Because each pattern of r bits is equally probable, coding the pattern number s by a perfect method would cost $\log_2(_nC_r)$ bits. Therefore using the probability of each value of r, the theoretical cost of using the method to code n bits is $$e_q^*(n) = -\sum_{r=0}^{n} c_q(n, r)\log_2(c_q(n, r)) + \sum_{r=0}^{n} c_q(n, r)\log_2(_nC_r)$$

In one embodiment, it may occur that $e_q^*(n) = ne_q(n)$, i.e. that a perfect method of coding r and s will achieve perfect coding of the binary data. The technique illustrated is therefore capable of perfect compression performance for embodiments or instances where q is stationary. Exactly the same result would be obtained in embodiments where Action 220 of FIG. 1 resulted in using '0' as the binary digit whose occurrences are counted.

In other embodiments, occurrences of more lengthy and/or complex symbol strings may be sought. As described in more detail below, these may comprise symbol strings having a fixed, predefined form, or alternatively, may comprise symbol strings having flexibility, such as, in form, length, and/or composition, for example. In various embodiments, the extent of flexibility may be predefined or it may be calculated with some dependence at least in part upon some characteristic or characteristics of the data. Some further example symbol strings are set out below and may include:

Any letter, symbol or character a, such as, for example, "x" (This may include a single symbol position);
Any bigraph $a_1a_2$, such as "st";
Any combination $a_1\ a_2\ a_3$, such as "str";
Any longer combination $a_1\ a_2\ a_3\ \ldots\ a_n$, such as "st___ng" where the underscores represent single symbol positions.

In one embodiment, illustrated by Action 260 of FIG. 1, after positions of a first symbol string have been determined, positions of a second symbol string in a list of possible or known symbol strings may be determined.

Gradually, in this manner, a set of data may, in one embodiment, be coded. As coding proceeds, a coder may transmit to a decoder information about symbol strings that have been located, such as position(s), in real time for some embodiments. Alternatively in other embodiments, coded data may be stored locally as a compressed representation.

The example embodiment may be expressed in pseudo-code as follows:

---
For A = Symbol Strings
    Indicate R=Number of Occurrences of A
    Indicate the particular pattern S of R Occurrences
End

---

As a further illustrative, non-limiting, example embodiment, consider a short sequence S of 8 symbol strings S1 to S8. For purposes of illustration, symbol strings here comprise a fragment of text, although claimed subject matter is not limited in scope in this respect. Such fragments are short and, furthermore, symbol strings may not comprise text at all and still be within the scope of claimed subject matter. A space between the two words also comprises a symbol string in this example, as illustrated below:

| S: 'the test' | | | | | | | |
|----|----|----|----|----|----|----|----|
| S1 | S2 | S3 | S4 | S5 | S6 | S7 | S8 |
| t | h | e | 'space' | t | e | s | t |

| 0100 0000 | 0x01 0000 | 0x0x 0010 | 0x1x 01x0 | 1xxx 1xx1 |
|---|---|---|---|---|
| Scan for h | Scan for space | Scan for s | Scan for e | Scan for 't' |

Deliberately in this example embodiment the letters chosen are among the most common ones to occur in English text. Of course, claimed subject matter is not limited to this example embodiment or to any one particular embodiment. This example is simply an illustration for explanatory purposes. Many other potential embodiments are intended to be included within the scope of the claimed subject matter.

In this simple example, first the symbol 'h' is selected as a symbol string for coding. There is one occurrence of 'h' in the 8 symbols of the example. To code the positions of 'h' the first symbol string code r is therefore 1. There are $_8C_1$ possible patterns of 1 positions for 'h' in the 8 symbols. By reference to FIG. 1 in the Pascal triangle at 400, it can be seen that $_8C_1$ is 8. There are 8 possible patterns, all equally probable, and therefore having a theoretical cost of $\log_2 8$ bits, i.e. 3 bits. It is always the case that $_nC_1$ is n.

Continuing with the example, the coder and decoder may, in this illustrative embodiment, either have a table of all 8 possible patterns of 1 bit among 8, or, in another embodiment, they may have a means of generating and identifying this particular pattern. It is noted that this does not differ fundamentally from the binary situation. The positions not occupied by 'h' could all be considered to be '0' when coding the positions occupied by 'h' as '1'. The pattern sought is therefore 0100 0000, and depending on the order in which they are stored or generated, there will be a number $s_h$ identifying this pattern. The code for 'h' is therefore (1, $s_h$).

The coding, in this embodiment, may then move on to 'space' and similarly code it by (1, $s_{space}$), and then code 's' by (1, $s_s$)

At this point all the symbols occurring once have been coded, and there remain the symbols 'e' and 't'. The next one selected may be 'e' in which case there are two occurrences, so that the number of patterns is 28. In the code for 'e', (2, $s_e$), $s_e$ will indicate one of these 28 symbols. Finally in coding 't', the code will be (3, $s_t$). The collected code for this message is therefore:

1, $s_h$, 1, $s_{space}$, 1, $s_s$, 2, $s_e$, 3, $s_t$

In other embodiments, the symbols to be coded could have been selected in any order, and at this point in the explanation of the illustrative embodiment no particular method of selection has been shown to be preferred; however it will now be shown that the order of selection can affect the compression performance, in various embodiments.

In one embodiment, compression may be improved still further by a method analogous to "significance switching." More specifically, here, for each successive symbol string that is coded, positions to be coded become fewer as more and more symbol strings become determined by position. This additional information regarding position may be employed to provide additional compression.

It is noted that, in some instances, as soon as a symbol has been coded, the number of unknown positions is reduced. In the example above, putting 'x' for a known position, the unknown positions reduce as follows in Table 1:

An advantage may be gained by taking account of the reducing number of unknown data positions. In one embodiment, this may entail effectively skipping over the unknown positions when the pattern is applied.

In coding 'h' in the illustrative embodiment, there is no difference, one pattern from $_8C_1=8$ is selected by $s_h$. However in coding 'space', both the coder and decoder will know, in this embodiment, that there are only 7 unknown positions. So that the selected pattern can be based on 1 bit from the 7 unknown bits, i.e. one pattern from $_7C_1=7$ may be selected by $s_{space}$. The theoretical cost of this is therefore reduced to $\log_2 7=2.8$ bits. There is no such thing as 0.8 of a bit, of course, but on average in a long message it may be possible to achieve this by using an efficient method of coding s. Similarly in coding 's', the number of combinations to select the pattern from may be reduced again, to $_6C_1=6$, with a theoretical cost of $\log_2 6=2.6$ bits.

A large advantage of this Skipping approach can now be seen in coding the two occurrences of 'e'. To code the two positions of 'e', one of $_5C_2=10$ patterns is to be selected with an expected cost of $\log_2 10=3.3$ bits. Compared to the previous example in which the data length was always 8, this has been reduced from 28 patterns which would have cost an expected $\log_2 28=4.8$ bits.

An even larger advantage may be now gained. Assuming the coder and decoder, in this embodiment, know that they have now reached the final symbol string, and that it is 't', then the cost of coding the three occurrences of 't' is zero bits. Of course some method of knowing this is advantageous, as will be explained below.

The advantage gained from this Skipping approach is tabulated below in Table 2:

| | Code | Theoretical s Cost without 'Skipping' | Theoretical s Cost with 'Skipping' |
|---|---|---|---|
| h | 1, $s_h$ | 3 | 3 |
| space | 1, $s_{space}$ | 3 | 2.8 |
| s | 1, $s_s$ | 3 | 2.6 |
| e | 2, $s_e$ | 4.8 | 3.3 |
| t | 3, $s_t$ | 5.8 | 0 |

This of course is a very simple example, non-limiting, illustrative embodiment. In other embodiments, a coder could choose symbol strings for coding in order to reduce the cost of coding the pattern selection s. In the example given this may be by coding the rarest symbols first but in a real application a more complex approach may be justified. This may not be a consideration in coding binary data because the number of '0' patterns is always the same as the number of '1' patterns for any given value of the first code r, because the number of patterns with n-r bits is $_nC_{n-r}$ which is always the same as $_nC_r$.

However with more than two symbols, it may become important to minimize the cost of sending the pattern selection S. However, it is advantageous in some embodiments to consider how the selection of symbol strings for coding might be made.

A set of symbol strings may be, in one embodiment, evaluated with respect to a set of data in some order which may or may not be predetermined. Suppose, for the purpose of illustration, as an example embodiment, symbol strings here have predetermined order 'e' 't' 'a' 'o' 'i' 'n' 's' 'h' 'r' 'd' 'space' 'l' 'u', Apart from the position assigned to 'space' this corresponds to the frequency of letter normally encountered in English text. After 'space' there are a further 16 letters to consider of which only the first two are shown here, although, of course, claimed subject matter is not limited in scope to this example or to any particular example.

For this particular embodiment, a technique is desired to indicate that there are no instances of a symbol string. One way of doing this, in a particular embodiment, would be to code r as zero whenever a symbol string does not occur. In the previous example (in which the data block is the phrase "the test"), and taking the symbol strings in this order, the code becomes:

2, $s_e$, 3, $s_t$, 0, 0, 0, 0, 1, $s_s$, 1, $s_h$, 0, 0, 1, $s_{space}$, 0, 0, 0, . . .

In doing so, while it may be reasonable to code r=0 to jump over a reasonable number of symbol strings, the advantage of ordering the symbols to reduce the total cost of sending s for each symbol string has been lost. Instead, one embodiment might take the symbols in REVERSE order, becoming . . . 0, 0, 0, 1, $s_{space}$, 0, 0, 1, $s_h$, 1, $s_s$, 0, 0, 0, 0, 3, $S_t$, 2, $s_e$ Or, omitting the 'e' as being the final symbol . . . 0, 0, 0, 1, $s_{space}$, 0, 0, 1, $s_h$, 1, $s_s$, 0, 0, 0, 0, 3, $s_t$ In general, in instances where data is sparse, there may be many empty symbol string groups, and it can be wasteful to send a long sequence of the r=0 codes to indicate the successive empty symbol string groups.

An improvement might be made, in one embodiment, by introducing a further symbol to be used in the symbol string code positions where r is expected, which we might call ESC1. ESC1 may always be followed by a symbol j indicating an integer value, which is the number of symbol strings to jump. If j were 0, that would be the same as r=0. A value of j>0 may, in this embodiment, jump forward through the symbol string sequence and a value of j<0 would, in one embodiment, move through it backwards. Continuing the previous example (in which the data block is the phrase "the test"), and assuming that the text which is being coded consists only of the 26 letters of the English alphabet plus 'space', it is noted that when scanning the symbols in reverse order of frequency of occurrence in normal English, 16 are not used. The example can therefore be prefixed by ESC1 16. The example embodiment with ESC1 used in place of multiple values of r=0 is:

ESC1, 16, 1, $s_{space}$, ESC1, 2, 1, $s_h$, 1, $s_s$, ESC1, 4, 3, $s_t$

Assuming it is better however to code 'e' before 't', the embodiment could use ESC1 to jump backwards:

ESC1, 16, 1, $s_{space}$, ESC1, 2, 1, $s_h$, 1, $s_s$, ESC1, 5, 2, $s_e$, ESC1, −1, 3, $s_t$ ESC1 could also be used, in one embodiment, to jump to the end of a list of symbols, or in the case where the order is not predetermined, two ESC1 symbols in a row could be used, in one embodiment, to indicate that the coding is finished, allowing the decoder to fill out any unknown positions with the final symbol string selected. ESC1 may, in one embodiment, provide a mechanism for jumping through a predetermined list of symbol strings. There are many variations that could be used, and the subject matter is not to be limited to any particular effect of ESC1. It is also understood that ESC1, may be represented by any symbol or indication and is not limited to a particular encoding.

In further embodiments, a further Escape symbol ESC2 could be introduced to occur in the positions where either or both of r or ESC1 are expected, after which a symbol string could be given explicitly. This could be used with or without a predetermined order of selecting symbol strings. In embodiments, without a predetermined order it could before every symbol string specify the symbol string that comes next. If used with embodiments with a predetermined order ESC2 could be used to take a symbol string out of order, after which the scanning might, in some embodiments, continue in order, of after which the scanning might return to the next symbol string it might have taken had the ESC2 not been given. ESC2 may be used in some embodiments as a mechanism for forcing a particular symbol string to be selected. There are many variations that could be used, and the subject matter is not to be limited to any particular effect of ESC2. It is also understood that ESC2 may be represented by any symbol or indication and is not limited to a particular encoding.

Any form or type of coding to code the values of r or s or ESC1 or j or ESC2 and claimed subject matter is not limited to a particular form or type. For example in some embodiments, a Huffinan coder, a Golomb coder, a binary arithmetic coder, or other methods including those as yet undisclosed might be employed, to provide a few examples. Of course, these are simply examples and the claimed subject matter is not limited in scope to such examples.

It is possible that, in one embodiment, when the end of a symbol string group is determined by whichever method, the decoder may not know what the next symbol string is to be. Such as, for example if the sequence of symbol strings to be coded has not been predetermined. In one embodiment, the identity of the new symbol might be coded as soon as the end of group occurs. This however is but one possibility and the method is not to be limited in this respect. For example, in one embodiment, the entire communication could be carried out without knowing what the symbol strings are. In one such embodiment, the decoder may simply assign its own choice of temporary tokens to be substituted with actual symbol strings at some future time.

However, it may also be desirable in some circumstances to employ a similar approach if the length of a set of data and/or number of symbol strings is not known. Various approaches may be possible in situations where the length of a set of data being coded, for example, is not known and claimed subject matter is not limited in scope to a particular approach. For example, in one embodiment, this might be handled by having a standard length. Alternately in another embodiment, length information may be prefixed to coded information. However, if multiple sets of data are being coded and most have the same length, to prefix length may be inefficient from a compression standpoint. Likewise, continuing with this notion, for a long communication of data, if a standard length is employed to sub-divide the data, variation from a standard length may, in one embodiment, be handled by communicating or coding a set of data at the end smaller than the standard length.

One embodiment of the technique may include partitioning the total length of a data set before coding. If there is a standard partition length, the coder and decoder may determine how many partitions there are, and the length of final partition if it is less than the standard length. For example in one embodiment, if a set of data 102 symbol strings long is being coded and the standard length of a partition is 5, then 21 partitions are present with the final one having a length of 2. Again, as previously discussed, the total length may be included in the data code in many ways and the examples given are not intended to be restrictive. Claimed subject matter is intended to include these example approaches as well as other possible approaches.

Likewise, several approaches are also possible with respect to handling symbol strings. For example, as previously illustrated, in one embodiment, a predetermined order of symbol strings may be employed. However, alternately, symbol strings may be ordered relative to their frequency of occurrence if known or capable of being determined or approximated. For example, using English simply as an illustrative example, this might the following order: 'e' 't' 'a' 'o' 'i' 'n' 's' 'h', or indeed the reverse of this order, and so on. A "space" may be included in such order as its statistics indicate in a sample. Also, there may be symbol strings that do not occur, which may form an empty symbol string group to be signaled. With such an approach, both the coder and the decoder have an order of symbol strings.

Another approach may include an embodiment in which the coders explicitly prefix a set of data, for example, with a symbol string. Likewise in other embodiments, a symbol string may alternately be post-fixed or otherwise embedded so that a decoder may make appropriate determinations from coded data. It is likewise possible that, in other embodiments, a system may employ two modes, one in which a predetermined order of symbol strings is communicated and another in which symbol strings are prefixed or otherwise embedded. These modes could occur in any order and mode switching may be indicated, in one embodiment, by a special symbol used for that purpose.

In still another possible embodiment, a coder and decoder could adopt a method of constructing new symbol strings from symbol strings already received. This level of flexibility may permit an encoder to select or change symbol strings and modes of communication to improve compression. In an example embodiment, it might well be the case that not all predefined symbol strings are used, in which case, to avoid signaling a large number of empty groups by repeating the ESC1 j symbols, there might be a new symbol string which signals "No More Groups" or "End of Data", for example. This possibility was introduced above as was the possibility that two successive occurrences of the ESC1 symbol might serve this purpose.

In some embodiments, side information might accompany a data set. For example, in the case of text, font, size, weight, colour and/or style might comprise such side information. This may be communicated or coded any number of ways. In one embodiment, side information may be inserted in coded data in any position so that a decoder may appropriately associate it with a symbol string. In another embodiment, it might be desirable to handle side information combined with a symbol string as a symbol string itself, hence forming additional groups. For example, an italic 'e' may form a separate symbol string from normal 'e', as one simple example. Likewise, in an embodiment, a special symbol may be employed to switch between different embedding styles or approaches, if desired.

Embodiments in accordance with claimed subject matter may be applied to coding of data of all types, including non-numeric data, such as symbolic data, for example, converted into numerical form by any convenient mapping prior to application of coding. As is noted, some embodiments may perform well for run length coding, although it will, of course, be understood that claimed subject matter is not limited to that application. It is intended that embodiments of claimed subject matter be applied to any one of a number of different types of data coding. Therefore, claimed subject matter is not intended to be limited in terms of the type of data to which it may be applied.

Figure 3:
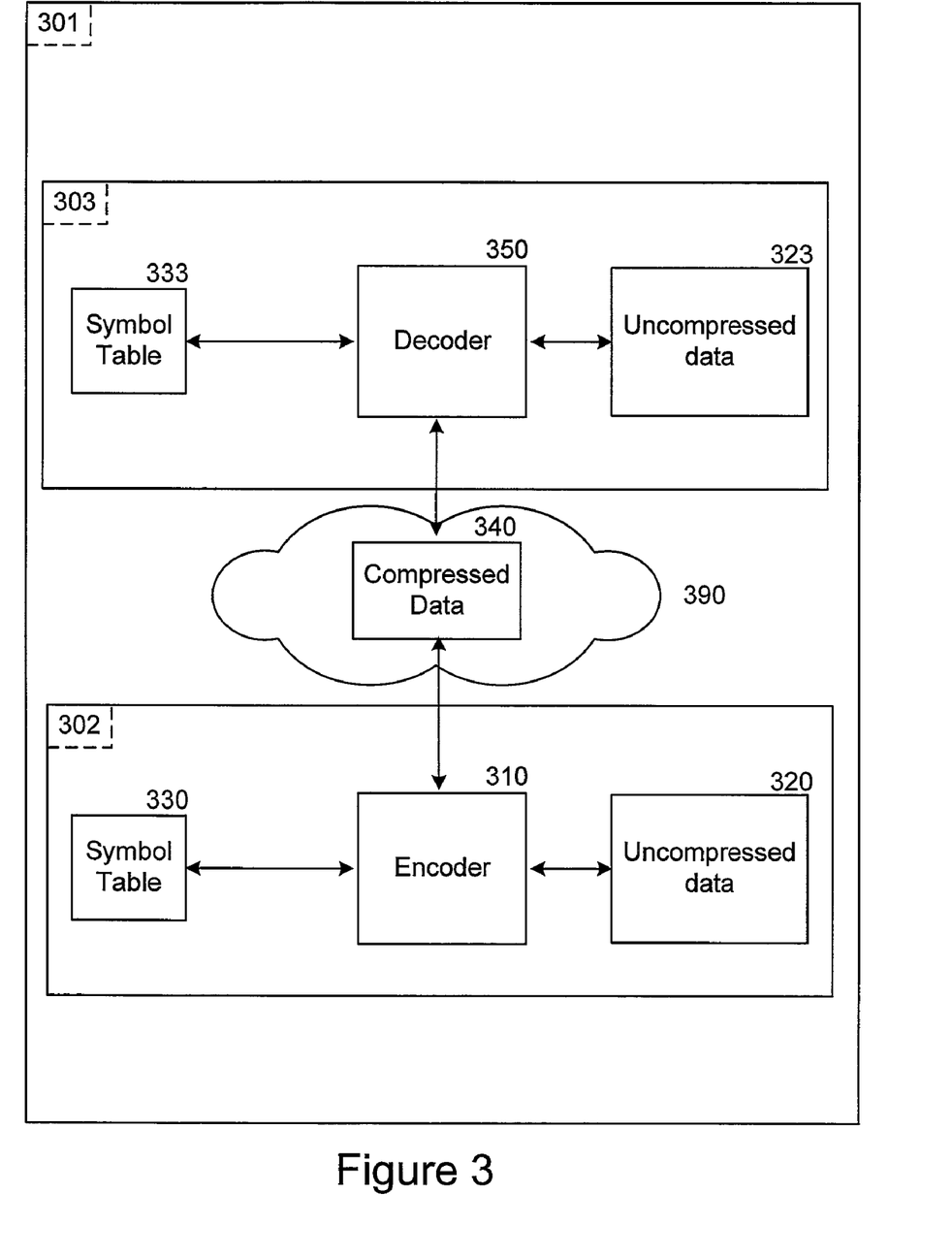
FIG. 3 is a block diagram illustrating an example embodiment of a system and an apparatus in accordance with claimed subject matter.

FIG. 3 is a block diagram illustrating an example embodiment of a system 301 comprising an encoding apparatus 302 and a decoding apparatus 303. In one embodiment, the system may include the encoding apparatus, the decoding apparatus and a wireless network 390. Other embodiments may comprise one or more other network types, and/or one or more other interconnection medium.

In one embodiment, encoding apparatus 302 may include an encoder 310 which may be capable of performing the example embodiments described above and illustrated in FIGS. 1 & 2. Encoder 310 may take uncompressed data 320 and encode it, or a portion of it, into compressed data 340. In one embodiment, the encoding may be facilitated by a symbol table 330. In one embodiment, the encoder apparatus may transmit the compressed data to a decoder apparatus. For an embodiment, encoder 310 may comprise a symbol string selector capable of selecting a symbol string to encode, and may also comprise a first symbol string code generator capable of generating a first symbol string code indicative of the number of occurrences of the selected symbol string within a block of data. Encoder 310 may further comprise a second symbol string code generator capable of generating a second symbol string code indicative of the pattern of occurrences of the selected symbol string, as well as a combiner capable of combining the first and second symbol string codes into a compressed data code. However, this is merely an example embodiment of a coder, and the scope of the claimed subject matter is not limited in this respect.

In one embodiment, the decoding apparatus 303 may include a decoder 350, which may be capable of performing the reverse of the example embodiments described above and illustrated in FIGS. 1 & 2. Decoder 350 may take compressed data 340 and decode it, or a portion of it, into uncompressed data 323. In one embodiment, the decoding may be facilitated by a symbol table 333. In one embodiment, the decoder apparatus may receive the compressed data from an encoder apparatus.

It is noted, of course, that claimed subject matter is not limited to particular embodiments. Therefore, in addition to covering methods for coding and/or decoding of data, claimed subject matter is also intended to cover, for example, software incorporating such methods and to coders and/or decoders (whether implemented in hardware or software, or a combination of hardware and software). Claimed subject matter is also intended to include a video or audio codec embodying such methods and/or a video or audio compression system whereby data may be encoded according to a method as described or claimed. For example, embodiments may include transmitting data across a communications channel for reconstruction be a decoder at the far end. Likewise, alternatively, in another embodiment in accordance with claimed subject matter coded data may be stored rather than transmitted. Thus, claimed subject matter is intended to cover these as well as other embodiments.

Embodiments described herein are not limited to any particular hardware or software configuration; they may find applicability in any computing or processing environment. Embodiments may be implemented in hardware, software, firmware or a combination thereof. Embodiments may be implemented in programs executing on programmable machines such as mobile or stationary computers, personal digital assistants, and/or similar devices that each include a processor, a storage medium readable or accessible by the processor (including volatile and non-volatile memory and/or storage elements), at least one input device, and one or more output devices. Program code may be applied to data entered using the input device to perform the functions described and to generate output information. The output information may be applied to one or more output devices.

Programs may be implemented in a high level procedural or object oriented programming language to communicate with a processing system. Programs may also be implemented in assembly or machine language.

A program may be stored on a storage medium or device, e.g. compact disk read only memory (CD-ROM), digital versatile disk (DVD), hard disk, firmware, non-volatile memory, magnetic disk or similar medium or device, that is readable by a general or special purpose programmable machine for configuring and operating the machine if the storage medium or device is read by the computer to perform the procedures described herein. The system may also be considered to be implemented as a machine-readable or accessible storage medium, configured with a program, where the storage medium so configured causes a machine to operate in a specific manner. Other embodiments are within the scope of the following claims.

Figure 4:
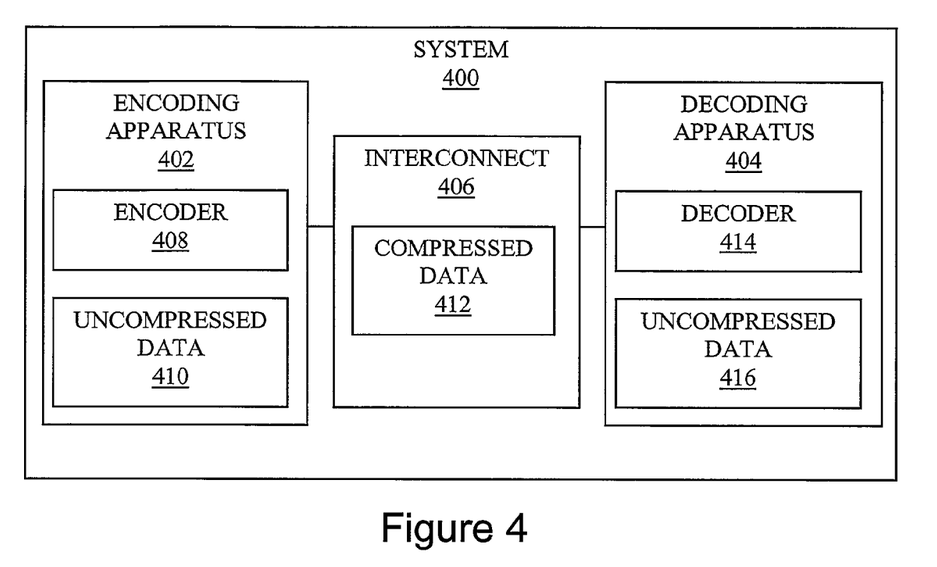
FIG. 4 is a block diagram of an example embodiment of a system comprising an encoding apparatus and a decoding apparatus coupled via an interconnect.

FIG. 4 is a block diagram illustrating an example embodiment of a system 400 comprising an example embodiment of an encoding apparatus 402 and a decoding apparatus 404 in accordance with the claimed subject matter. In one embodiment, system 400 may include encoding apparatus 402, decoding apparatus 404 and an interconnect 406. An interconnect may comprise, for example, one or more portions of a network, an interconnect between two or more devices in a computing platform, an interconnect between functional units of a device and/or an interconnect between two dies sharing a single package, as just a few examples. For example, system 400 may have encoding apparatus 402 and decoding apparatus 404 located within a single device and performing communications within the device.

In an embodiment, encoding apparatus 402 may include an encoder 408 which may be capable of performing one or more techniques as described above and/or as illustrated in FIGS. 1-3. As part of the technique, encoder 408 may take uncompressed data 410 and encode it, or a portion of it, into compressed data 412. In one embodiment, encoding apparatus 402 may transmit compressed data 412 to decoding apparatus 404, such as within a single device, over an interconnect, and/or the like.

In an embodiment, decoding apparatus 404 may include a decoder 414, which may be capable of performing one or more techniques as described above and/or as illustrated in FIGS. 1-3. As part of the technique decoder 414 may take compressed data 412 and decode it, or a portion of it, into uncompressed data 416. System 400 described above is not limited to any particular hardware or software configuration and all or part of system 400 may find applicability in any computing or processing environment such as is described below in connection with FIG. 5, for example.

Figure 5:
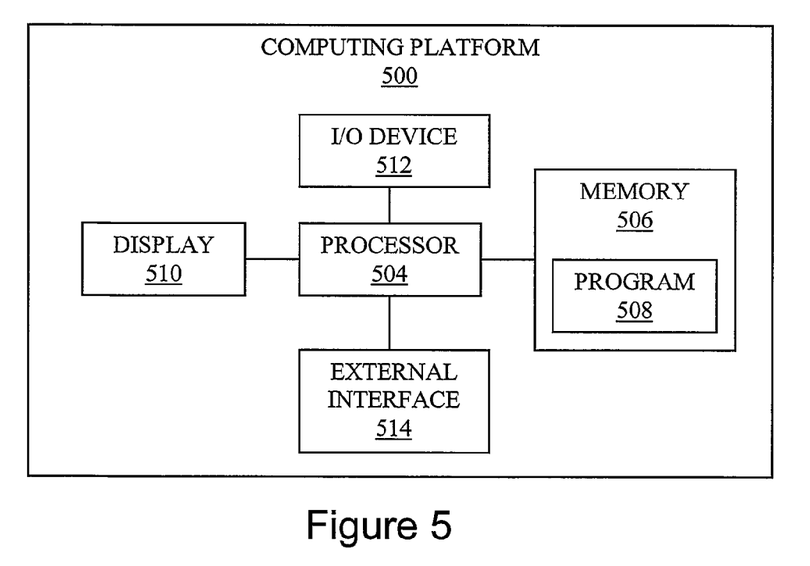
FIG. 5 is a block diagram of an example embodiment of a computing platform.

Referring to FIG. 5, a block diagram of a an example computing platform 500 according to one or more embodiments is illustrated, although the scope of claimed subject matter is not limited in this respect. Computing platform 500 may include more and/or fewer components than those shown in FIG. 5. However, generally conventional components may not be shown, for example, a battery, a bus, and so on.

Computing platform 500, as shown in FIG. 5 may be utilized to embody tangibly a computer program and/or graphical user interface by providing hardware components on which the computer program and/or graphical user interface may be executed. Computing platform 500 may be utilized to embody tangibly all or a portion of embodiments described herein. Such a procedure, computer program and/or machine readable instructions may be stored tangibly on a computer and/or machine readable storage medium such as a compact disk (CD), digital versatile disk (DVD), flash memory device, hard disk drive (HDD), and so on. As shown in FIG. 5, computing platform 500 may be controlled by processor 504, including one or more auxiliary processors (not shown). Processor 504 may comprise a central processing unit such as a microprocessor or microcontroller for executing programs, performing data manipulations, and controlling the tasks of computing platform 500. Auxiliary processors may manage input/output, perform floating point mathematical operations, manage digital signals, perform fast execution of signal processing algorithms, operate as a back-end processor and/or a slave-type processor subordinate to processor 504, operate as an additional microprocessor and/or controller for dual and/or multiple processor systems, and/or operate as a coprocessor and/or additional processor. Such auxiliary processors may be discrete processors and/or may be arranged in the same package as processor 504, for example, in a multicore and/or multithreaded processor; however, the scope of the scope of claimed subject matter is not limited in these respects.

Communication with processor 504 may be implemented via a bus (not shown) for transferring information among the components of computing platform 500. A bus may include a data channel for facilitating information transfer between storage and other peripheral components of computing platform 500. A bus further may provide a set of signals utilized for communication with processor 504, including, for example, a data bus, an address bus, and/or a control bus. A bus may comprise any bus architecture according to promulgated standards, for example, industry standard architecture (ISA), extended industry standard architecture (EISA), micro channel architecture (MCA), Video Electronics Standards Association local bus (VLB), peripheral component interconnect (PCI) local bus, PCI express (PCIe), hyper transport (HT), standards promulgated by the Institute of Electrical and Electronics Engineers (IEEE) including IEEE 488 general-purpose interface bus (GPIB), IEEE 696/S-100, and so on, although the scope of the scope of claimed subject matter is not limited in this respect.

Other components of computing platform 500 may include, for example, memory 506, including one or more auxiliary memories (not shown). Memory 506 may provide storage of instructions and data for one or more programs 508 to be executed by processor 504, such as all or a portion of embodiments described herein, for example. Memory 506 may be, for example, semiconductor-based memory such as dynamic random access memory (DRAM) and/or static random access memory (SRAM), and/or the like. Other semiconductor-based memory types may include, for example, synchronous dynamic random access memory (SDRAM), Rambus dynamic random access memory (RDRAM), ferroelectric random access memory (FRAM), and so on. Alternatively or additionally, memory 506 may be, for example, magnetic-based memory, such as a magnetic disc memory, a magnetic tape memory, and/or the like; an optical-based memory, such as a compact disc read write memory, and/or the like; a magneto-optical-based memory, such as a memory formed of ferromagnetic material read by a laser, and/or the like; a phase-change-based memory such as phase change memory (PRAM), and/or the like; a holographic-based memory such as rewritable holographic storage utilizing the photorefractive effect in crystals, and/or the like; and/or a molecular-based memory such as polymer-based memories, and/or the like. Auxiliary memories may be utilized to store instructions and/or data that are to be loaded into memory 506 before execution. Auxiliary memories may include semiconductor based memory such as read-only memory (ROM), programmable read-only memory (PROM), erasable programmable read-only memory (EPROM), electrically erasable read-only memory (EEPROM), and/or flash memory, and/or any block oriented memory similar to EEPROM. Auxiliary memories also may include any type of non-semiconductor-based memories, including, but not limited to, magnetic tape, drum, floppy disk, hard disk, optical, laser disk, compact disc read-only memory (CD-ROM), write once compact disc (CD-R), rewritable compact disc (CD-RW), digital versatile disc read-only memory (DVD-ROM), write once DVD (DVD-R), rewritable digital versatile disc (DVD-RAM), and so on. Other varieties of memory devices are contemplated as well.

Computing platform 500 further may include a display 510. Display 510 may comprise a video display adapter having components, including, for example, video memory, a buffer, and/or a graphics engine. Such video memory may be, for example, video random access memory (VRAM), synchronous graphics random access memory (SGRAM), windows random access memory (WRAM), and/or the like. Display 510 may comprise a cathode ray-tube (CRT) type display such as a monitor and/or television, and/or may comprise an alternative type of display technology such as a projection type CRT type display, a liquid-crystal display (LCD) projector type display, an LCD type display, a light-emitting diode (LED) type display, a gas and/or plasma type display, an electroluminescent type display, a vacuum fluorescent type display, a cathodoluminescent and/or field emission type display, a plasma addressed liquid crystal (PALC) type display, a high gain emissive display (HGED) type display, and so forth, although the scope of the claimed subject matter is not limited in this respect.

Computing platform 500 further may include one or more I/O devices 512. I/O device 512 may comprise one or more I/O devices 512 such as a keyboard, mouse, trackball, touchpad, joystick, track stick, infrared transducers, printer, modem, RF modem, bar code reader, charge-coupled device (CCD) reader, scanner, compact disc (CD), compact disc read-only memory (CD-ROM), digital versatile disc (DVD), video capture device, TV tuner card, touch screen, stylus, electroacoustic transducer, microphone, speaker, audio amplifier, and/or the like.

Computing platform 500 further may include an external interface 514. External interface 514 may comprise one or more controllers and/or adapters to prove interface functions between multiple I/O devices 512. For example, external interface 514 may comprise a serial port, parallel port, universal serial bus (USB) port, and IEEE 1394 serial bus port, infrared port, network adapter, printer adapter, radio-frequency (RF) communications adapter, universal asynchronous receiver-transmitter (UART) port, and/or the like, to interface between corresponding I/O devices 512. External interface 514 for an embodiment may comprise a network controller capable of providing an interface, directly or indirectly, to a network, such as, for example, the Internet.

In the preceding description, various aspects of claimed subject matter have been described. For purposes of explanation, systems and configurations were set forth to provide a thorough understanding of claimed subject matter. However, these are merely example illustrations of the above concepts wherein other illustrations may apply as well, and the scope of the claimed subject matter is not limited in these respects. It should be apparent to one skilled in the art having the benefit of this disclosure that claimed subject matter may be practiced without specific details. In other instances, well-known features were omitted and/or simplified so as to not obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The following is claimed:

1. A method comprising:
   generating, with a processor of a coding device, a first symbol string code indicative of a number of occurrences of a symbol string within data to be encoded;
   generating a second symbol string code indicative of a pattern of occurrences of the symbol string; and
   coding the first symbol string code and the second symbol string code into a compressed data code.

2. The method of claim 1, further comprising identifying the symbol string based at least in part on a predetermined list of symbol strings.

3. The method of claim 1, further comprising identifying the symbol string based at least in part on a frequency of occurrence of the symbol string within the data.

4. The method of claim 1, further comprising identifying the symbol string based at least in part on a frequency of occurrence of the symbol string in a generalized data set.

5. The method of claim 1, further comprising identifying the symbol string based at least in part on an estimated compression efficiency.

6. The method of claim 1, further comprising coding metadata corresponding to the symbol string into the compressed data code.

7. The method of claim 6, wherein the metadata comprises at least one of a size associated with one or more occurrences of the symbol string, a font associated with one or more occurrences of the symbol string, a size associated with one or more occurrences of the symbol string, a weight associated with one or more occurrences of the symbol string, a color associated with one or more occurrences of the symbol string, a case associated with one or more occurrences of the symbol string, or a style associated with one or more occurrences of the symbol string.

8. The method of claim 1, wherein a final symbol string within the data is not coded.

9. The method of claim 1, further comprising coding a token into the compressed data code, wherein the token represents the symbol string.

10. The method of claim 1, further comprising:
    generating two additional symbol string codes for each additional symbol string that occurs within the data; and
    coding the additional symbol string codes into the compressed data code.

11. An apparatus comprising:
    a processor configured to:
       generate a first symbol string code indicative of a number of occurrences of a symbol string within data to be encoded;
       generate a second symbol string code indicative of a pattern of occurrences of the symbol string; and
       code the first symbol string code and the second symbol string code into a compressed data code; and
    a transmitter operatively coupled to the processor and configured to transmit the compressed data code to a decoder.

12. The apparatus of claim 11, further comprising a memory operatively coupled to the processor and configured to store an ordered list of symbol strings, wherein the ordered list identifies an order in which to code the symbol strings.

13. The apparatus of claim 12, wherein the memory is also configured to store a plurality of patterns that includes the pattern, wherein the plurality of patterns are based at least in part on a length of the data and at least in part on the number of occurrences of the symbol string.

14. The apparatus of claim 11, wherein the processor is further configured to:
    determine a frequency of occurrence of the symbol string within the data; and
    identify the symbol string based at least in part on the frequency of occurrence.

15. The apparatus of claim 11, wherein the processor is further configured to code metadata corresponding to one or more occurrences of the symbol string into the compressed data code.

16. The apparatus of claim 15, wherein the metadata comprises at least one of a size associated with one or more occurrences of the symbol string, a font associated with one or more occurrences of the symbol string, a size associated with one or more occurrences of the symbol string, a weight associated with one or more occurrences of the symbol string, a color associated with one or more occurrences of the symbol string, a case associated with one or more occurrences of the symbol string, or a style associated with one or more occurrences of the symbol string.

17. The apparatus of claim 11, wherein the processor is further configured to code an identification of the symbol string into the compressed data code.

18. The apparatus of claim 11, wherein the processor is further configured to code a token into the compressed data code, wherein the token represents the symbol string.

19. An apparatus comprising:
    means for generating a first symbol string code indicative of a number of occurrences of a symbol string within data to be encoded;
    means for generating a second symbol string code indicative of a pattern of occurrences of the symbol string; and
    means for coding the first symbol string code and the second symbol string code into a compressed data code.

20. The apparatus of claim 19, further comprising means for transmitting the compressed data code to a decoder.

21. The apparatus of claim 19, further comprising:
    means for determining a frequency of occurrence of the symbol string within the data; and
    means for identifying the symbol string based at least in part on the frequency of occurrence.

22. The apparatus of claim 21, further comprising means for transmitting an ordered list of symbol strings to a decoder, wherein the ordered list is based at least in part on the frequency of occurrence of the symbol string within the data.

23. The apparatus of claim 19, further comprising means for coding metadata into the compressed data code, wherein the metadata corresponds to one or more occurrences of the symbol string.

24. The apparatus of claim 19, further comprising means for storing a plurality of patterns that includes the pattern, wherein the plurality of patterns are based at least in part on a length of the data and at least in part on the number of occurrences of the symbol string.

25. The apparatus of claim 19, further comprising means for coding a token into the compressed data code, wherein the token represents the symbol string.

26. The apparatus of claim 19, further comprising means for identifying the symbol string based at least in part on an estimated compression efficiency for the data.

27. A tangible computer-readable medium having stored thereon, computer-executable instructions that, if executed by a computing device, cause the computing device to perform a method comprising:
    identifying a symbol string within data to be encoded, wherein the data includes a plurality of symbol strings;
    generating a first symbol string code indicative of a number of occurrences of the symbol string within the data;
    generating a second symbol string code indicative of a pattern of occurrences of the symbol string; and
    coding the first symbol string code and the second symbol string code into a compressed data code.

28. The tangible computer-readable medium of claim 27, wherein the symbol string is identified based at least in part on a predetermined list of symbol strings.

29. The tangible computer-readable medium of claim 27, wherein the symbol string is identified based at least in part on a frequency of occurrence of the symbol string within the data.

30. The tangible computer-readable medium of claim 27, wherein the symbol string is identified based at least in part on an estimated compression efficiency for the data.

31. The tangible computer-readable medium of claim 27, wherein the symbol string is identified based at least in part on a frequency of occurrence of the symbol string in a generalized data set.

32. The tangible computer-readable medium of claim 27, wherein symbol string codes corresponding to a final symbol string of the plurality of symbol strings are not coded into the compressed data code.

33. The tangible computer-readable medium of claim 27, further comprising:
    identifying a second symbol string from the plurality of symbol strings;
    generating a third symbol string code indicative of a second number of occurrences of the second symbol string within the data;
    generating a fourth symbol string code indicative of a second pattern of occurrences of the second symbol string; and
    coding the third symbol string code and the fourth symbol string code into the compressed data code.

34. The tangible computer-readable medium of claim 27, further comprising coding metadata into the compressed data code, wherein the metadata comprises at least one characteristic associated with one or more occurrences of the symbol string.

* * * * *